(12) United States Patent
Shlomot et al.

(10) Patent No.: US 8,468,017 B2
(45) Date of Patent: Jun. 18, 2013

(54) MULTI-STAGE QUANTIZATION METHOD AND DEVICE

(75) Inventors: Eyal Shlomot, Shenzhen (CN); Jiliang Dai, Shenzhen (CN); Fuliang Yin, Shenzhen (CN); Xin Ma, Shenzhen (CN); Jun Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 25 days.

(21) Appl. No.: 12/772,190

(22) Filed: May 1, 2010

(65) Prior Publication Data

US 2010/0217753 A1  Aug. 26, 2010

Related U.S. Application Data

(63) Continuation of application No. PCT/CN2008/072909, filed on Oct. 31, 2008.

(30) Foreign Application Priority Data

Nov. 2, 2007  (CN) .......................... 2007 1 0166746
Dec. 3, 2007   (CN) .......................... 2007 1 0197033

(51) Int. Cl.
    *G10L 19/12*  (2006.01)
    *G10L 19/00*  (2006.01)
(52) U.S. Cl.
    USPC .......................... 704/222; 704/230; 704/258
(58) Field of Classification Search
    USPC .............. 704/256.8, 230, 222, 500–504, 256, 704/258
    See application file for complete search history.

(56) References Cited

U.S. PATENT DOCUMENTS

| 5,023,910 A | | 6/1991 | Thomson | |
|---|---|---|---|---|
| 5,307,441 A | * | 4/1994 | Tzeng ........................... | 704/222 |
| 5,966,688 A | * | 10/1999 | Nandkumar et al. ......... | 704/222 |
| 5,974,378 A | * | 10/1999 | LeBlanc et al. ............... | 704/222 |

(Continued)

FOREIGN PATENT DOCUMENTS

| CN | 101019171 A | 8/2007 |
|---|---|---|
| EP | 1 760 694 A2 | 10/1998 |
| EP | 1 353 323 A1 | 10/2003 |
| GB | 2 238 696 A | 6/1991 |

OTHER PUBLICATIONS

State Intellectual Property Office of the People'S Republic of China, First Examination Report in Chinese Patent Application No. 200710197033.X (Apr. 21, 2009).

(Continued)

*Primary Examiner* — Pierre-Louis Desir
*Assistant Examiner* — Abdelali Serrou
(74) *Attorney, Agent, or Firm* — Leydig, Voit & Mayer, Ltd.

(57) ABSTRACT

The invention discloses a multi-stage quantization method, which includes the following steps: obtaining a reference codebook according to a previous stage codebook; obtaining a current stage codebook according to the reference codebook and a scaling factor; and quantizing an input vector by using the current stage codebook. The invention also discloses a multi-stage quantization device. With the invention, the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency.

8 Claims, 5 Drawing Sheets

U.S. PATENT DOCUMENTS

| | | | | |
|---|---|---|---|---|
| 6,122,338 | A * | 9/2000 | Yamauchi | 375/377 |
| 6,122,608 | A * | 9/2000 | McCree | 704/219 |
| 6,141,640 | A * | 10/2000 | Moo | 704/222 |
| 6,574,593 | B1 * | 6/2003 | Gao et al. | 704/222 |
| 6,581,032 | B1 * | 6/2003 | Gao et al. | 704/222 |
| 6,604,070 | B1 * | 8/2003 | Gao et al. | 704/222 |
| 6,606,592 | B1 | 8/2003 | Cho et al. | |
| 6,735,567 | B2 * | 5/2004 | Gao et al. | 704/258 |
| 6,757,649 | B1 * | 6/2004 | Gao et al. | 704/222 |
| 6,952,671 | B1 | 10/2005 | Kolesnik et al. | |
| 6,961,698 | B1 * | 11/2005 | Gao et al. | 704/229 |
| 7,149,683 | B2 * | 12/2006 | Jelinek | 704/208 |
| 7,269,552 | B1 * | 9/2007 | Prange et al. | 704/219 |
| 2004/0002856 | A1 * | 1/2004 | Bhaskar et al. | 704/219 |
| 2004/0023677 | A1 * | 2/2004 | Mano et al. | 455/500 |
| 2005/0002584 | A1 | 1/2005 | Qian et al. | |
| 2007/0094019 | A1 | 4/2007 | Nurminen | |
| 2007/0233474 | A1 | 10/2007 | Song | |
| 2007/0255558 | A1 * | 11/2007 | Yasunaga et al. | 704/222 |
| 2008/0052068 | A1 * | 2/2008 | Aguilar et al. | 704/230 |
| 2009/0037172 | A1 | 2/2009 | Fodrini et al. | |
| 2010/0211398 | A1 * | 8/2010 | Satoh et al. | 704/500 |

OTHER PUBLICATIONS

State Intellectual Property Office of the People'S Republic of China, First Examination Report in Chinese Patent Application No. 200710197033.X (Oct. 30, 2009).

1$^{st}$ Office Action in corresponding Russian Application No. 2010122308/08 (Apr. 16, 2011).

International Search Report in corresponding PCT Application No. PCT/CN2008/072909 (Feb. 12, 2009).

1$^{st}$ Office Action in corresponding European Application No. 08846274.2 (Apr. 5, 2011).

Written Opinion of the International Searching Authority in corresponding PCT Application No. PCT/CN2008/072909 (Feb. 12, 2009).

"G.729—Coding of Speech at 8 kbit/s using conjugate-structure algebraic-code-excited linear prediction (CS-ACELP)," General Aspects of Digital Transmission Systems, Mar. 1996, International Telecommunication Union, Geneva, Switzerland.

"G.729—Coding of Speech at 8 kbit/s using conjugate-structure algebraic-code-excited linear prediction (CS-ACELP), Annex B: A silence compression scheme for G.729 optimized for terminals conforming to Recommendation V.70," Series G: Transmission Systems and Media, Digital Transmission Systems—Terminal equipment —Coding of analogue signals by methods other than PCM, Nov. 1996, International Telecommunication Union, Geneva, Switzerland.

"G.729.1—G.729-based embedded variable bit-rate coder: An 8-32 kbits scalable wideband coder bitstream interoperable with G.729: New Annex C (DTX/CNG scheme) plus corrections to main body and Annex B, Amendment 4: New Annex C 'DTX/CNG scheme' plus corrections to main body and Annex B," Series G: Transmission Systems and Media, Digital Systems and Networks, Digital terminal equipments—Coding of analogue signals by methods other than PCM, Jun. 2008, International Telecommunication Union, Geneva, Switzerland.

1$^{st}$ Office Action in corresponding Korean Application No. 10-2010-7011340 (Jun. 28, 2011).

State Intellectual Property Office of the People's Republic of China, Examination Report in Chinese Patent Application No. 200710197033X (May 8, 2009).

Communication in European Application No. 08846274.2-2225, mailed Oct. 4, 2010.

Final Office Action in corresponding Korean Application No. 10-2010-7011340 (Feb. 15, 2012).

Office Action in corresponding Korean Patent Application No. 10-2012-7009738 (Apr. 30, 2012).

Extended European Search Report in corresponding European Patent Application No. 12166983.2 (Jul. 18, 2012).

Final Office Action in corresponding Korean Patent Application No. 10-2012-7009738 (Dec. 31, 2012).

* cited by examiner

MULTI-STAGE QUANTIZATION METHOD AND DEVICE

CROSS-REFERENCE TO RELATED APPLICATIONS

This application is a continuation of International Application No. PCT/CN2008/072909, filed on Oct. 31, 2008, which claims priority to Chinese Patent Application No. 200710166746.X, filed on Nov. 2, 2007 and Chinese Patent Application No. 200710197033.X, filed on Dec. 3, 2007, all of which are hereby incorporated by reference in their entireties.

FIELD OF THE INVENTION

The present invention relates to the field of data compression technique, and more particularly, to a method and device for multi-stage quantization.

BACKGROUND

With the rapid development of data compression technologies, vector quantization has been widely used. Vector quantization (VQ) is an efficient data compression technique, which constructs a plurality of scalar data columns into a vector and performs overall quantization in the vector space. As a result, the data is compressed while no much information is lost. The procedure of VQ is as follows: each frame of k samples of a signal waveform or each parameter set of k parameters is constructed into a vector in a k-dimensional Euclidean space and the vector is then "collectively" quantized. When the vector is quantized, the k dimensional infinite space is divided into M regions with borders, and the input signal vector is compared with these borders and quantized to a central vector of a region whose borders have the minimum "distance" from the input signal vector. Computational complexity of VQ is mainly concerned with codebook searching according to a certain distortion measure criterion, and the spatial complexity is mainly determined by the size of the used codebook space. Generally, the larger the codebook space is, the larger the required storage is, and the higher the computational complexity of the codebook searching is, though the higher the quantization accuracy is.

Currently, the computational complexity of VQ is generally reduced by using multi-stage quantization or split codebook quantization. A procedure of a two-stage quantization is as shown in FIG. 1, in which an input vector x goes through a first stage VQ using codebook 1 and a second stage VQ using codebook 2. Though the codebook size of M1 and M2 are used in the two stages of VQ respectively, the resultant codebook effect is equivalent to a one-stage VQ having the size of M1*M2. Therefore, in contrast to the one-stage VQ system, the number of computations for distortion and comparison and the required storage of codebooks are respectively reduced from M1*M2 to M1+M2.

The split codebook quantization method is used to reduce the complexity in searching and storage when high-dimensional vectors are quantized. In this method, a vector to be quantized is split into two or more sub-vectors for quantization. An example of splitting the vector into two sub-vectors is described in the following. Assuming the input vector is $x=[x_1, x_2, \ldots, x_N]^T$, the used codebook is Y, and the quantized bit length is L, then the storage space needed for storing the codebook Y is $N \times 2^L$. If x is split into to sub-vectors $x_a=[x_1, x_2, \ldots, x_K]^T$ and $x_b=[x_{K+1}, x_{K+2}, \ldots, x_N]^T$, then the used codebook is split into $Y_a$ and $Y_b$ accordingly. Assuming the quantized $x_a$ has a bit length of $L_a$ and the quantized $x_b$ has a bit length of $L_b$, where $L=L_a+L_b$, the space needed for storing the codebook $Y_a$ is $K \times 2^{L_a}$, and the space needed for storing the codebook $Y_b$ is $(N-K) \times 2^{L_b}$, and thus the totally needed storage space is far less than the space $N \times 2^L$ needed for storing the codebook Y. In particular, when the dimensions of $x_a$ and $x_b$ are the same and the corresponding dimension components have similar statistical properties, i.e. $Y_a=Y_b$, more storage can be saved.

According to the voice coding standard "conjugate-structure algebraic-code-excited linear prediction voice encoder" by International Telecommunication Union (ITU), the signal spectrum parameter, i.e. Linear Spectrum Frequency (LSF), obtained after the Linear Prediction Coding (LPC) analysis is quantized by using a fourth order Moving Average (MA) model prediction quantizer to predict LSF coefficients of the current frame. The prediction error is quantized using a two-stage VQ. The first stage is to process a ten dimensional vector by using codebook L1 with 7 bit code. The second stage splits the ten dimensions into two 5-dimensional codebooks L2 and L3, where L2 represents the lower five dimensions and L3 represents the higher five dimensions, and both use 5 bit code.

However, according to the voice coding standard "silence compression solution of conjugate-structure algebraic-code-excited linear prediction voice encoder" by ITU, VQ of the LSF coefficients of the noise frame is done using a two-stage quantization. The input of the first stage quantizer is the prediction error of the predictor, and the quantization error from the first stage is quantized in the second stage. The first stage quantization codebook for the noise frame is a subset of the first stage codebook for the voice frame, and the second stage quantization codebook for the noise frame is a subset of the second stage codebook for the voice frame. That is, two sub-codebooks with the length of 16 bits may be trained from two codebooks with the length of 32 bits, which are both the second stage quantization codebooks, and codebook indices are saved in an array.

Conventional quantization has the following drawback:
When the computational complexity of the VQ procedure is reduced using the multi-stage quantization method, the codebooks for quantization at each stage are independent from each other and each codebook requires a corresponding codebook space. As a result, the storage space is wasted and the resource usage efficiency is low.

SUMMARY

An object of the present disclosure is to provide a multi-stage quantization method and device, which can overcome drawbacks of conventional quantization, namely, the waste in storage space caused by independent codebooks of each quantization stage.

To meet this object, an embodiment of the present disclosure provides a multi-stage quantization method, which includes the following steps:

obtaining a reference codebook according to a previous stage codebook;

obtaining a current stage codebook according to the reference codebook and a scaling factor; and quantizing an input vector by using the current stage codebook.

Another embodiment of the present disclosure further provides a multi-stage quantization device, which includes:

a previous stage codebook storage unit, adapted to store a previous stage codebook or codebooks of two or more previous stages;

a reference codebook obtaining unit, adapted to obtain a reference codebook according to a codebook stored by the previous stage codebook storage unit;

a scaling factor storage unit, adapted to store a scaling factor;

a current stage codebook obtaining unit, adapted to obtain a current stage codebook according to the reference codebook obtained by the reference codebook obtaining unit and the scaling factor stored by the scaling factor storage unit; and a vector quantization unit, adapted to quantize an input vector using the current stage codebook obtained by the current stage codebook obtaining unit.

The embodiments of the above technical solutions have the following advantages: the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency.

DETAILED DESCRIPTION

In the following, embodiments of the present disclosure will be further described in detail with reference to the examples and drawings.

In linear prediction voice coding, vector quantization needs to be performed on the linear prediction parameters. An example is to transform a linear prediction parameter into a 10-dimensional LSF parameter through a two-stage quantization.

Figure 1:
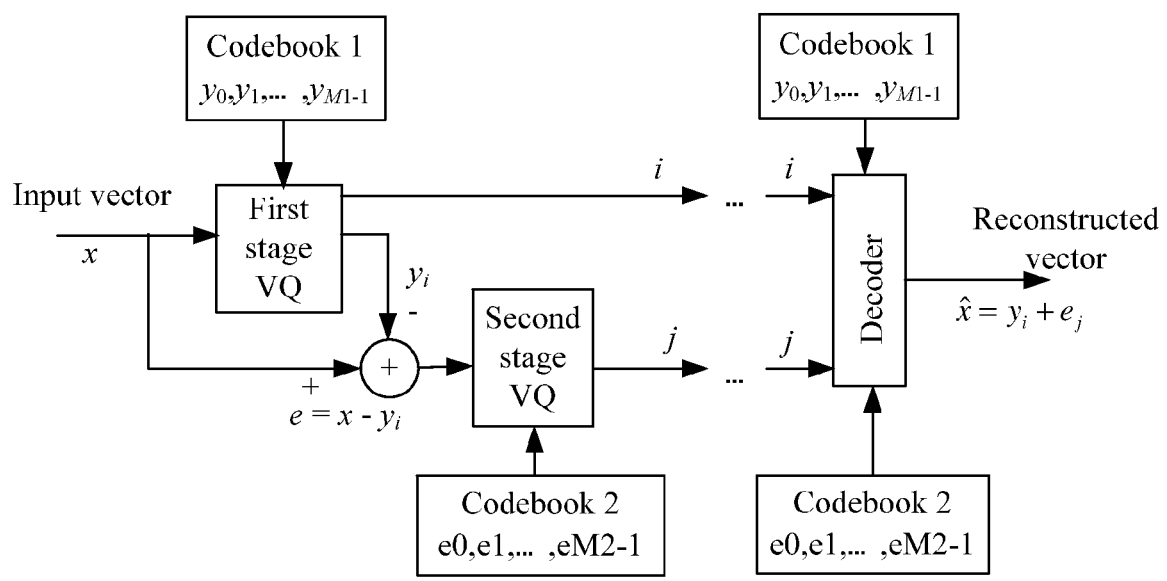
FIG. 1 is a flow chart of a conventional two-stage quantization.
Figure 2:
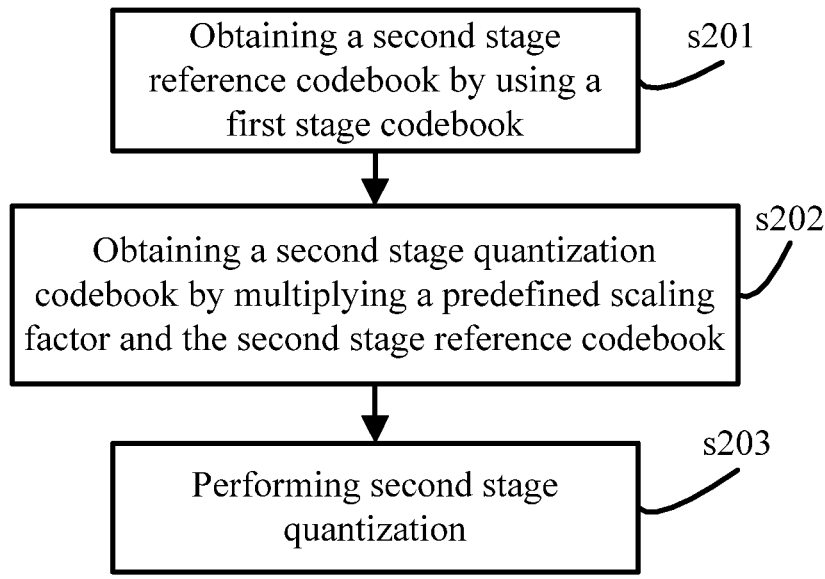
FIG. 2 is a flow chart of a two-stage quantization according to an embodiment of the present disclosure.

A flow chart of a two-stage quantization method according to an embodiment of the present disclosure is shown in FIG. 2, which specifically includes the following steps:

A scaling factor (set) $\gamma$ is obtained first, which may be done through the following training method.

$\gamma$ can be obtained by training a lot of samples, and the simplest training method may be implemented by comparing a radium of a quantization error vector space obtained after a first stage quantization and a radium of a first stage quantization input vector space. It is assumed that there are L samples, each of which is an N-dimensional vector, and the first stage quantization error is:

$$x_1 = [x_{1,0}, x_{1,1}, \ldots, x_{1,N-1}]^T$$

where, $x_{1,0}, x_{1,1}, \ldots, x_{1,N-1}$ are respectively the quantization error values for each dimension of the previous stage quantization vector;

Also, it is assumed that the first stage quantization vector is:

$$x_0 = [x_{0,0}, x_{0,1}, \ldots, x_{0,N-1}]^T$$

where, $x_{0,0}, x_{0,1}, \ldots, x_{0,N-1}$ are respectively the value of each dimension of the previous stage quantization vector.

In this case, scaling factory $\gamma$ may be computed through the following equation:

$$\gamma = \frac{\sum_{i}^{L-1} \sqrt{\frac{x_{1,0}^2 + x_{1,1}^2 + \ldots + x_{1,N-1}^2}{x_{0,0}^2 + x_{0,1}^2 + \ldots + x_{0,N-1}^2}}}{L}$$

Alternatively, an optimum value of $\gamma$ may be found by searching according to the Minimum Mean Square Error (MMSE) method. Specifically, the range of 0 to 2 is divided into M parts and let:

$$\gamma_0 = 2M, \gamma_1 = 4/M, \ldots, \gamma_{N-1} = 2(N-1)/M$$

M ones of the $\gamma$ values are multiplied with the previous stage codebook Y1 to obtain M new codebooks:

$$\gamma^1 Y1, \gamma^2 Y1, \ldots, \gamma^{M-1} Y1$$

The M codebooks are respectively used to quantize the sample vectors. If there are L samples, the $j^{th}$ new codebook is used to quantize each sample vector in order to search for the optimum codebook vector for each sample vector and meanwhile to obtain the minimum weight quantization error $e_{j,i}$. It is assumed that the sum of the minimum weight quantization errors of all the samples is:

$$E_j = \sum_{i=0}^{L-1} e_{j,i}$$

Each codebook $\gamma_j Y_1$ corresponds to an $E_j$. The minimum value Emin of $E_j$ may be found, and $\gamma_j$ corresponding to Emin is the value of the optimum scaling vector $\gamma$. If the quantization accuracy is not high enough, the range $(\gamma_{min} - 1/N, \gamma_{min} 30\ 1/N)$ may be further divided into N parts, and the optimum $\gamma$ is then found in the N $\gamma$ values. This procedure may be iterated repeatedly until the needed accuracy is achieved.

What is described in the above is the case of only one $\gamma$, and two or more $\gamma$ values may be also trained and saved in an array. The indices of $\gamma$ may be quantized using n bits. As a result, the number of the original codebooks is increased by $2^n$. Meanwhile, adaptability of the codebooks is improved and the quantization accuracy may be increased.

At block s201, vector quantization is performed on the linear prediction parameter of the linear prediction voice coding according to the existing quantization technique to get an index value idx1, which is represented by 7 bits code. This is the first stage VQ, and the first stage quantization codebook is expressed as $Y_1 = \{y_i | i = 0, \ldots 2^7 - 1\}$.

At block s202, the first stage quantization codebook is used in the second stage quantization as a reference codebook:

$$Y_1 = \{y_i | i = 0, \ldots 2^7 - 1\}$$

The scaling factor vector $\Lambda_n$ between the second stage quantization codebook and the first stage quantization codebook is already trained, which may be quantized using N bits, that is, $\Lambda_{n-1} = \{\gamma_i | i = 0, \ldots 2^N - 1\}$.

Based on the above method, the size of the second stage quantization codebook is 7+N bits, and the codebook is:

$$Y_n = \gamma_i \cdot Y_{n-1}, i = 0, \ldots 2^N - 1$$

The values of the scaling factors in the previously defined scaling factor set γ are multiplied with the first stage codebook Y1, which is used as the reference codebook, to obtain $2^N-1$ new codebooks, i.e. $\gamma_0 Y1, \gamma_1 Y1 \ldots \gamma_{M-1} Y1$. Thus, a codebook set of $2^N-1$ second stage quantization codebooks is obtained. The process proceeds to block s203.

At block s203, the sample vectors are quantized by using the corresponding one of the $2^N-1$ codebooks obtained at block s202. Specifically, the first stage quantization error is taken as the input vector of the second stage quantization and the generated $2^N$ codebooks are fully searched. Then, a location index idx 2 and a location index fidx are taken as the output of the second stage quantization, wherein the location index idx2 indicates the location of a vector in the codebook that makes the following weighted mean square error have the minimum value; and the location index fidx indicates the location of the codebook in the codebook set:

$$E_{LSF} = \sum_{i=1}^{10} W_i(\omega_i - \hat{\omega}_i)^2$$

During the inverse quantization, first, the first stage inverse quantized vector is found in the first stage codebooks by using the first stage quantization index idx1 and represented as Y1(idx1). Next, the corresponding scaling factor $\gamma_{fidx}$ is obtained from the scaling factor set γ. $\gamma_{fidx} \times Y1$ is the second stage codebook used at the encoding end, thus the reconstructed vector at the second stage is $\gamma_{fidx} \times Y1(idx2)$, and the final inverse quantization result is $Y1(idx1)+\gamma_{fidx} \times Y1(idx2)$.

According to the embodiment, the current stage codebooks may be obtained according to the previous stage codebooks, by using the correlation between the current stage codebooks and the previous stage codebooks. As a result, it does not require an independent codebook space for the current stage codebooks, which saves the storage space and improves the resource usage efficiency.

Here, the previous stage codebooks may specifically include a previous stage codebook or the codebooks of two or more previous stages. The difference in the content included in the set will not affect the claimed scope of the present disclosure.

Figure 3:
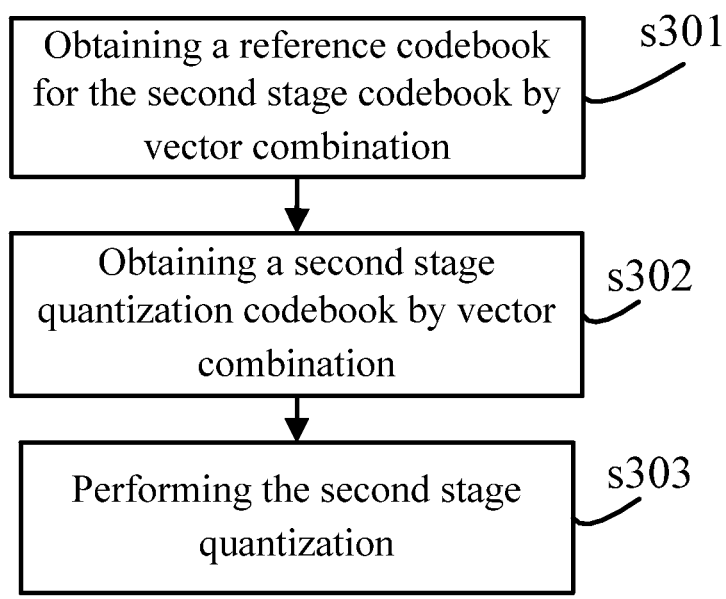
FIG. 3 is a flow chart of a two-stage quantization according to another embodiment of the present disclosure.

FIG. 3 illustrates a two-stage quantization method according to another embodiment of the present disclosure, which specifically includes the following steps:

At block s301, vector quantization is performed on the linear prediction parameters of the linear prediction voice coding according to the existing quantization technique to get an index value idx1, which is represented by using 7 bit code. That is, in the first stage VQ, the first stage quantization codebook is assumed to be $Y_1 = \{y_i | i=0, \ldots 2^7-1\}$.

After the first stage quantization, dynamic range of the quantization error is further reduced. At this time, the vectors in the previous stage codebook may be combined to reduce the codebook length, which will save bits. For example, K bit codebooks that are frequently used may be selected from the first stage codebook of 7 bits in advance and the indices of the K bit codebooks are saved in an array, which may be represented as cb(i), i=0, 1, . . . , $2^K-1$. The indices of the K bits form the reference codebook Y2c for the second stage codebook.

At block s302, the scaling factor vector $\Lambda_n$ between the second stage quantization codebook and the first stage quantization codebook is already trained, which is quantized using N bits, that is, $\Lambda_{n-1} = \{\gamma_i | i=0, \ldots 2^N-1\}$. Based on the above method, the size of second stage quantization codebook is K+N bits, and the codebook is:

$$Y_2 = \gamma_i \cdot Y2c, i=0, \ldots 2^N-1$$

The length of the codebook may be further reduced. The K bit codebooks that are frequently used are selected from the first stage codebooks of 7 bits and the indices of the most frequently used K bit codebooks are saved in an array, which may be represented as cb(i), i=0, 1, . . . , $2^K-1$. Thus, the second stage quantization result is K+N bits. What is removed is the less frequently used codebook; as a result, no much loss is made to the quantization while the number of quantized bits is reduced.

At block s303, the first stage quantization error is taken as a target vector, the above $2^N$ codebooks are searched for the best code-vector that allows the weighted mean square error (MSE) as shown in the following equation to be minimum, and the index of the found code-vector is treated as the output of the second stage quantization.

$$E_{LSF} = \sum_{i=1}^{10} W_i(\omega_i - \hat{\omega}_i)^2$$

where, Wi is the weight coefficient. The quantization output result has two parts, one of which is the location index idx2 indicating the location of the codebook vector in the codebook, and the other part is the index fidx indicating the location of the scaling factor in the scaling factor vector.

During the inverse quantization, first, the first stage inverse quantized vector is found in the first stage codebook by using the first stage quantization index idx1 and represented as Y1(idx1). Next, the corresponding scaling factor $\gamma_{fidx}$ is obtained from the scaling factor set γ. $\gamma_{fidx} \times Y2c$ is the second stage codebook used at the encoding end, thus the reconstructed vector at the second stage is $\gamma_{fidx} \times Y2c(cb(idx2))$, and the final inverse quantization result is $Y1(idx1)+\gamma_{fidx} \times Y2c(cb(idx2))$.

According to the embodiment, the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency.

Figure 4:
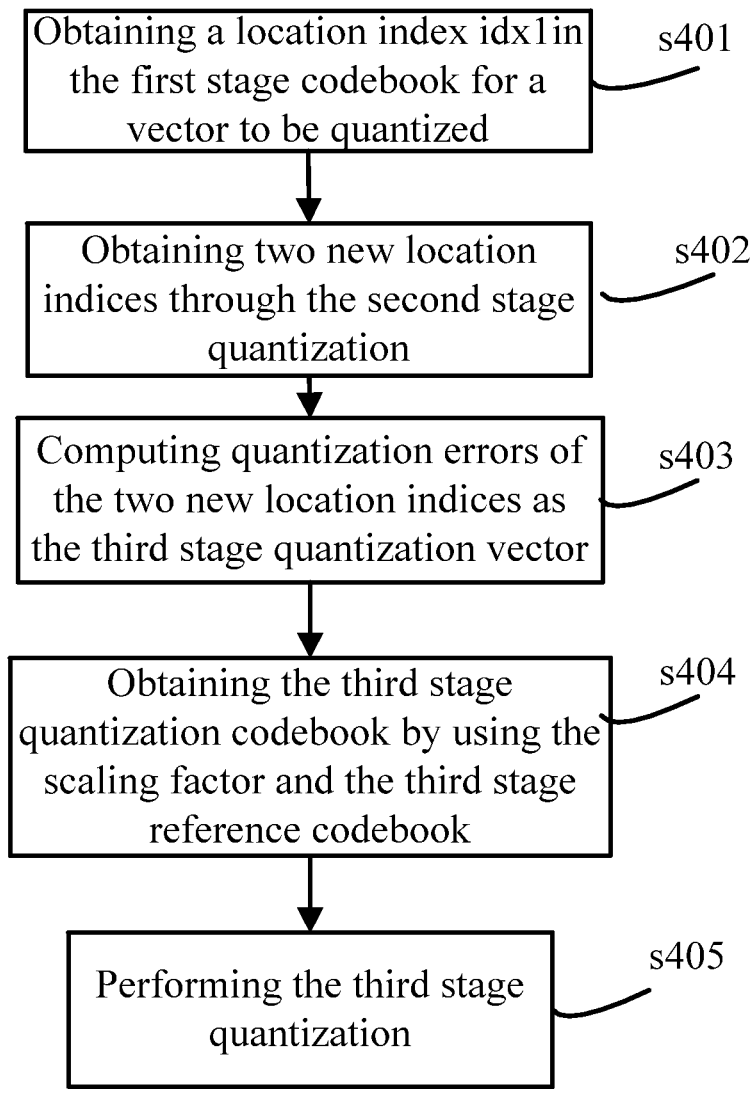
FIG. 4 is a flow chart of a three-stage quantization according to an embodiment of the present disclosure.

FIG. 4 illustrates a three-stage quantization method according to another embodiment of the present disclosure. In the embodiment, the vector to be quantized is 10-dimensional, the quantization schemes for the first two stags use independent codebooks, and the quantization scheme for the third stage is based on this embodiment. Specifically, the procedure includes the following steps:

The procedure of training the scaling factor set is performed in advance:

γ is obtained by training a lot of samples, and the simplest training method may be implemented by comparing the radium of the quantization error vector space obtained after the first stage quantization and radium of the first stage quantization vector space. It is assumed that there are L samples, each of which is a N-dimensional vector, and the first stage quantization error is:

$$x_1 = [x_{1,0}, x_{1,1}, \ldots, x_{1,N-1}]^T$$

Also, it is assumed the first stage quantization vector is:

$$x_0 = [x_{0,0}, x_{0,1}, \ldots, x_{0,N-1}]^T$$

Thus, the scaling factor γ is computed through the following equation:

$$\gamma = \frac{\sum_{i}^{L-1} \sqrt{\frac{x_{1,0}^2 + x_{1,1}^2 + \ldots + x_{1,N-1}^2}{x_{0,0}^2 + x_{0,1}^2 + \ldots + x_{0,N-1}^2}}}{L}$$

Alternatively, an optimum value of γ may be found by searching according to the MMSE method. Specifically, 0 to 2 is divided into M parts and let:

$$\gamma_0 = 2/M, \gamma_1 = 4/M, \ldots, \gamma_{N-1} = 2(N-1)/M$$

M ones of these γ values are multiplied with the previous stage codebook Y1 to obtain M new codebooks:

$$\gamma^1 Y1, \gamma^2 Y1, \ldots, \gamma^{M-1} Y1$$

The M codebooks are respectively used to quantize the sample vectors. If there are L samples, the $j^{th}$ new codebook is used to quantize each sample vector in order to search for the optimum codebook for each sample vector and meanwhile to obtain the minimum weighted quantization error $e_{j,i}$. It is assumed that the sum of the minimum weight quantization errors of all the samples is:

$$E_j = \sum_{i=0}^{L-1} e_{j,i}$$

Each codebook $\gamma_j Y_1$ corresponds to a $E_j$, the minimum value Emin can be found from $E_j$, and $\gamma_j$ corresponding to the Emin is the value of the optimum scaling vector. If the quantization accuracy is not high enough, the range ($\gamma_{min} - 1/N$, $\gamma_{min} + 1/N$) may be further divided into N parts, and the optimum value may be found in the N γ values. This procedure may be iterated repeatedly until the needed accuracy is achieved.

What is described in the above is the case of only one γ, and two or more γ may be trained and saved in an array, and indices of γ may be quantized using n bits. In this case, the number of the original codebooks is increased by $2^n$. Meanwhile, adaptability of the codebooks is improved and the quantization accuracy may be increased.

The procedure of three-stage quantization:

At block s401, the first stage codebook is searched for the input vector to be quantized according to the weight minimum mean square error method, and thus the location index idx1 indicating the location of the code vector in the codebook is found.

$$E_{LSF} = \sum_{i=1}^{10} W_i (\omega_i - \hat{\omega}_i)^2$$

where, Wi is the weight coefficient.

At block s402, the first stage quantization error is taken as the input vector of the second stage quantization, and split quantization is used to split the second stage codebook into two 5-dimensional codebooks $Y_2^1, Y_2^2$. The quantization is performed for higher 5 dimensions and lower 5 dimensions respectively in a way similar to block s301, and their quantization results are respectively two location indices $idx_2^1$, $idx_2^2$.

At block s403, the quantization errors for the higher and lower 5 dimensions are respectively computed as the third stage quantization vector.

At block s404, the two split codebooks of the second stage quantization are taken as the reference codebooks of two split codebooks of the third stage quantization. The scaling factor in the scaling factor array is taken as the coefficient of the reference codebooks, thereby obtaining a pair of codebook sets. The length of the scaling factor code chart is $2^N$, and thus the $2^N$ pairs of newly obtained split codebooks are respectively $Y_3^1 \{\gamma_0 \times Y_2^1, \gamma_1 \times Y_2^1, \ldots, \gamma_{2^N-1} \times Y_2^1\}, Y_3^2 = \{\gamma_0 \times Y_2^2, \gamma_1 \times Y_2^2, \ldots, \gamma_{2^N-1} \times Y_2^2\}$.

At block s405, the corresponding codebook sets are searched for the higher five and lower five dimensions of the third stage quantization vector, respectively. The third stage quantization results are the locations $idx_3^1, idx_3^2$ in the respective codebooks that each indicates a vector that allow the sum of the weighted mean square errors for the higher or lower 5 dimensions to be minimum and the index fidx of the corresponding scaling factor, which are:

$$E_{fidx} = \sum_{i=0}^{4} (\omega_i - \gamma_{fidx} Y_2^1 (idx_3^1)_i)^2 + \sum_{i=5}^{9} (\omega_i - \gamma_{fidx} Y_2^2 (idx_3^2)_i)^2$$

During the inverse quantization, first, the first stage inverse quantized vector is found in the first stage codebook by using the first stage quantization index idx1 and represented as Y1(idx1). Next, the split sub-vectors $Y_2^1(idx_2^1)$, $Y_2^2(idX_2^2)$ of the second inverse quantization are reconstructed according to the two split sub-codebooks of the second stage by respectively using the second stage quantization indices $idx_2^1$, $idx_2^2$. After that, the corresponding scaling factor $\gamma_{fidx}$ is obtained from the scaling factor set γ using the scaling factor index of the third stage quantization. If $\gamma_{fidx} \times Y_2^1, \gamma_{fidx} \times Y_2^2$ are the two split sub-codebooks of the third stage codebook used at the encoding end, then the reconstructed sub-vectors of the third stage are respectively $\gamma_{fidx} \times Y_2^1(idx_3^1)$, $\gamma_{fidx} \times Y_2^1(idx_3^2)$, and the final inverse quantization result is:

$$\hat{\omega}_i = \begin{cases} Y1(idx1)_i + Y_2^1(idx_2^1)_i + \gamma_{fidx} \times Y_2^1(idx_3^1)_i, & 0 \le i < 5 \\ Y1(idx1)_i + Y_2^2(idx_2^2)_i + \gamma_{fidx} \times Y_2^2(idx_3^2)_i, & 5 \le i < 10 \end{cases}$$

According to the embodiment, the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency.

Figure 5:
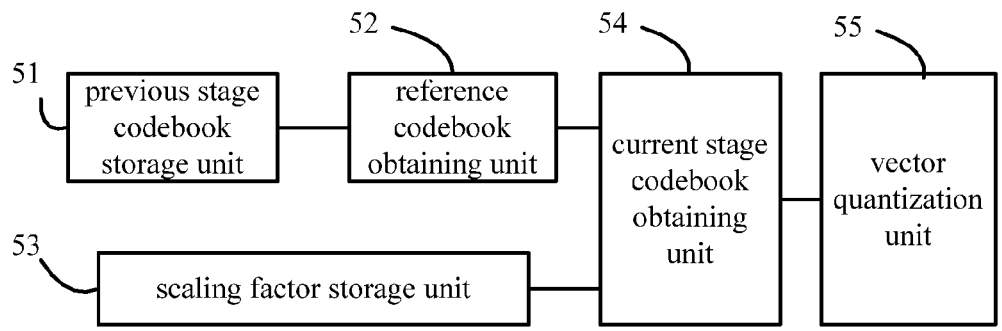
FIG. 5 is a block diagram of a multi-stage device according to an embodiment of the present disclosure.

A multi-stage quantization device according to an embodiment of the present disclosure is shown in FIG. 5, which includes a previous stage codebook storage unit 51, a reference codebook obtaining unit 52, a scaling factor storage unit 53, a current stage codebook obtaining unit 54, and a vector quantization unit 55.

The previous stage codebook storage unit 51 is connected to the reference codebook obtaining unit 52. The current stage codebook obtaining unit 54 is connected to the reference codebook obtaining unit 52, the scaling factor storage unit 53, and the vector quantization unit 55, respectively.

The previous stage codebook storage unit 51 is adapted to store the previous codebook or the codebooks of two or more previous stages.

The reference codebook obtaining unit 52 is adapted to obtain a reference codebook according to a codebook stored in the previous stage codebook storage unit 51, which is specifically adapted to:

obtain the reference codebook according to a previous stage codebook stored in the previous stage codebook storage unit 51; or obtain the reference codebook according to a codebook selected from the previous codebook or the codebooks of two or more previous stages stored in the previous stage codebook storage unit 51; or combine vectors in the previous stage codebook stored in the previous stage codebook storage unit 51 to generate the reference codebook.

The scaling factor storage unit 53 is adapted to store a scaling factor, which may be obtained by training in advance.

The current stage codebook obtaining unit 54 is adapted to obtain a current stage codebook according to the reference codebook obtained by the reference codebook obtaining unit 52 and the scaling factor stored by the scaling factor storage unit 53.

The vector quantization unit 55 is adapted to quantize an input vector using the current stage codebook obtained by the current stage codebook obtaining unit 54.

Figure 6:
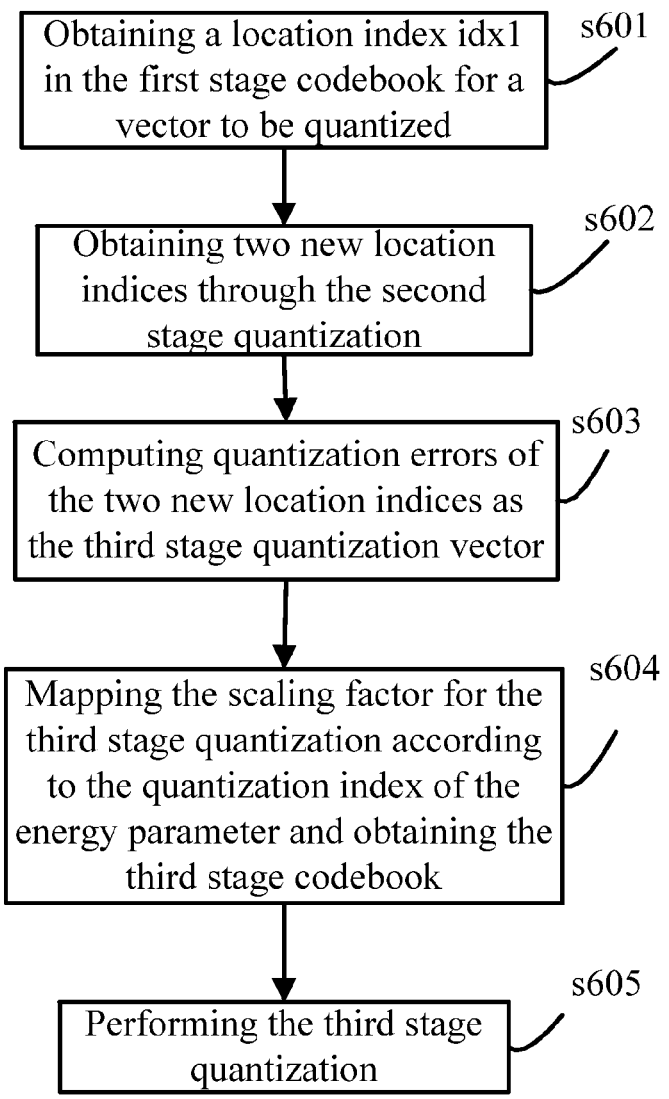
FIG. 6 is a flow chart of a three-stage quantization according to another embodiment of the present disclosure.

Another three-stage quantization method according to an embodiment of the present disclosure is shown in FIG. 6. In this embodiment, the spectrum parameter and energy parameter are required to be quantized. Generally, for spectrum quantization, a multi-stage quantization is needed to meet its quantization accuracy requirement, while for the energy quantization just one-stage quantization is enough to meet its quantization accuracy requirement. It is assumed that the energy parameter is already quantized and the quantization result is idx_E. It is further assumed that the spectrum vector to be quantized is 10-dimensional, the quantization scheme for the first two stags uses independent codebooks, and the quantization scheme for the third stage is based on the present disclosure. The scaling factor used for the third stage may still be obtained from the scaling factor code table, while the indices of the scaling factors are no longer coded and transmitted. Instead, the indices of the previous stage quantization (for the same or different vectors to be quantized) may be directly mapped to obtain the scaling factor for the third stage quantization of the vector to be quantized. Specifically, the procedure includes the following steps:

The procedure of training the scaling factor set is performed in advance:

An optimum $\gamma$ value may be found by searching according to the MMSE method. Specifically, 0 to 2 is divided into M parts and let:

$$\gamma_0 = 2/M, \gamma_1 = 4/M, \ldots, \gamma_{N-1} = 2(N-1)/M$$

M ones of these $\gamma$ values are multiplied with the previous stage codebook Y1 to obtain M new codebooks:

$$\gamma_1 Y1, \gamma_2 Y1, \ldots, \gamma_{M-1} Y1$$

The M codebooks are respectively used to quantize the sample vectors. If there are L samples, the $j^{th}$ new codebook is used to quantize each sample vector in order to search for the optimum codebook for each sample vector and meanwhile to obtain the minimum weight quantization error $e_{j,i}$. It is assumed that the sum of the minimum weight quantization errors of all the samples is:

$$E_j = \sum_{i=0}^{L-1} e_{j,i}$$

Each codebook $\gamma_j Y_1$ corresponds to an $E_j$, the minimum value Emin is found from $E_j$, and $\gamma_j$ corresponding to the Emin is the value of the optimum scaling vector $\gamma$. If the quantization accuracy is not high enough, the range $(\gamma_{min}-1/N, \gamma_{min}+1/N)$ may be further divided into N parts, and the optimum value is then found in the N $\gamma$ values. This procedure may be iterated repeatedly until the needed accuracy is achieved.

The training procedure described above may be used to train two or more scaling factors, which may be saved in a scaling factor array. The length of the scaling factor array is $2^n$. If the optimum scaling factor is to be searched and coded from the array with $2^n$ scaling factors using the method described in embodiment 2, the computational complexity is too high. Meanwhile, additional code bits are needed to transmit the indices of the scaling factors. To overcome the problems, in this embodiment, an enhanced quantization method with low complexity and without extra bits is proposed.

The procedure of three-stage quantization at the encoding end:

At block s601, the first stage codebook is searched for the input vector to be quantized according to the weight minimum mean square error criterion, in order to obtain the location index idx1 of the code vector in the codebook.

$$E_{LSF} = \sum_{i=1}^{10} W_i(\omega_i - \hat{\omega}_i)^2$$

where, Wi is the weight coefficient.

At block s602, the first stage quantization error is taken as the second stage quantization vector, and split quantization is used to split the second stage codebook into two 5-dimensional codebooks $Y_2^1, Y_2^2$. For the higher 5 dimensions and lower 5 dimensions, quantization is respectively performed in a way similar to those done at block s301, and the quantization results are two location indices $idx_2^1, idx_2^2$.

At block s603, the quantization errors for the higher and lower five dimensions are respectively computed as the third stage quantization error.

At block s604, when quantized, the indices of the scaling factors may be obtained by searching the whole scaling factor array as described above. In addition to this, the indices of the scaling factors can also be found by bit mapping the quantization result of the previous stage. At this step, the scaling factor of the third stage quantization may be obtained by bit mapping the higher n bits of the quantization index idx_E for energy, and thus the third stage codebook may be obtained. Assuming that idx_E totally has m bits, the higher n bits are idx_E>>(m−n), the sign '>>' indicates the operation of right shifting. Thus, the mapped scaling factor of the third stage is $\gamma_{idx\_E>>(m-n)}$. Accordingly, the third stage codebooks of the higher and lower 5 dimensions are respectively $$Y_3^1 = \{\gamma_{idx\_E>>(m-n)} \times \hat{Y}_3^1\},$$

$$Y_3^2 = \{\gamma_{idx\_E>>(m-n)} \times \hat{Y}_3^2\},$$

where $\hat{Y}_3^1$, $\hat{Y}_3^2$ are the reference codebook of the third stage codebook, which may be the second stage quantization codebook or a sub-codebook of the first stage codebook.

At block s605, the third stage codebook is searched for the higher and lower five dimensions of the third stage quantization vector respectively. Thus, the locations $idx_3^1$, $idx_3^2$ of vectors that have the minimum sum of the weighted mean square errors with the respective higher and lower five divisional sub-vectors in the codebook are obtained. The locations $idx_3^1$, $idx_3^2$ are the third stage quantization result:

$$E_{fidx} = \sum_{i=0}^{4}(\omega_i - \gamma_{fidx}Y_2^1(idx_3^1)_i)^2 + \sum_{i=5}^{9}(\omega_i - \gamma_{fidx}Y_2^2(idx_3^2)_i)^2$$

During the inverse quantization at the decoding end, first, the first stage inverse quantized vector is found in the first stage codebook by using the first stage quantization index idx1 and represented as Y1(idx1). Then, the split sub-vectors, represented as $Y_2^1(idx_2^1), Y_2^2(idx_2^2)$, of the second stage inverse quantization are respectively reconstructed from the two split sub-codebooks of the second stage, by using the respective second stage quantization indices $idx_2^1, idx_2^2$. After that, $\gamma_{idx\_E>>(m-n)}$ of the third stage is obtained from the scaling factor set $\gamma$ by using the quantization index of the energy. If $\gamma_{idx\_E>>(m-n)} \times \hat{Y}_3^1, \gamma_{idx\_E>>(m-n)} \times \hat{Y}_3^2$ are the two split sub-codebooks of the third stage codebook used at the encoding end, then the reconstructed third stage vectors are respectively $\gamma_{idx\_E>>(m-n)} \times \hat{Y}_3^1(idx_3^1), \gamma_{idx\_E>>(m-n)} \times \hat{Y}_3^2(idx_3^2)$, and the final inverse quantization result is:

$$\hat{\omega}_i = \begin{cases} Y1(idx1)_i + Y_2^1(idx_2^1)_i + \gamma_{idx\_E>>(m-n)} \times \hat{Y}_3^1(idx_3^1)_i, & 0 \le i < 5 \\ Y1(idx1)_i + Y_2^2(idx_2^2)_i + \gamma_{idx\_E>>(m-n)} \times \hat{Y}_3^2(idx_3^2)_i, & 5 \le i < 10 \end{cases}$$

According to the embodiment, the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency. Furthermore, a method in which the scaling factor is obtained by mapping the known quantization results is utilized. This saves the computation of searching the scaling factor and the coding bits for the scaling factor indices. Thus, the quantization efficiency is further improved.

Furthermore, in the specific application of the embodiment, except for the quantization result of the energy parameter, the scaling factor can also be obtained by mapping the previous stage (the first or second stage) quantization index of the spectrum parameter to be quantized. Thus, even the result for other parameters is not available, the vector to be quantized can still be enhanced using the solution of the present disclosure.

Figure 7:
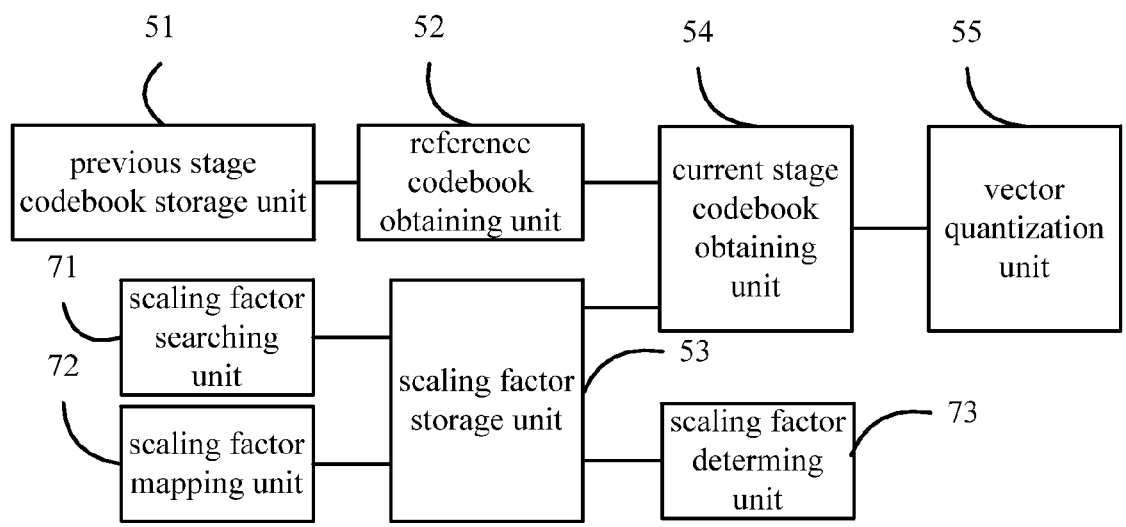
FIG. 7 is a block diagram of a multi-stage device according to another embodiment of the present disclosure.

As shown in FIG. 7, the multi-stage quantization device according to the embodiment of the present disclosure may further include a scaling factor searching unit 71 or a scaling factor mapping unit 72 or a scaling factor determination unit 73. Specifically:

the scaling factor searching unit 71 is adapted to obtain the scaling factor by searching a scaling factor array and transmit the scaling factor to the scaling factor storage unit 53;

the scaling factor mapping unit 72 is adapted to obtain the scaling factor by bit mapping quantization result of a previous stage and transmit the scaling factor to the scaling factor storage unit 53; and the scaling factor determination unit 73 is adapted to determine the scaling factor according to a previous stage quantization error and a previous stage quantization vector and transmit the scaling factor to the scaling factor storage unit 53.

According to the embodiment, the current stage codebook may be obtained according to the previous stage codebook, by using the correlation between the current stage codebook and the previous stage codebook. As a result, it does not require an independent codebook space for the current stage codebook, which saves the storage space and improves the resource usage efficiency.

Based on the description of the embodiments, those skilled in that art can clearly understand that the invention may be implemented with software combined with the necessary general hardware platform or just with hardware; though in most cases the foliner is a better way of implementation. Based on such understanding, the technical solution of the invention that makes a contribution to the art may be embodied in a software product. The computer software product is stored in a storage medium, which includes some instructions that enable a computing device (such as a personal computer, a server or a network device) to execute the method described by the embodiments of the invention.

What are described above are only preferred embodiments of the disclosure. It should be noted that any modification, equivalent substitution and improvement made by those skilled in the art within the spirit and scope of the disclosure are intended to be included in the scope of the disclosure.

What is claimed is:

1. A multi-stage quantization method, comprising: one of obtaining a reference codebook according to a previous stage codebook or codebooks from two or more previous stages, and combining vectors from the previous stage codebook to generate the reference codebook;

obtaining a current stage codebook multiplying the reference codebook by a scaling factor; and quantizing an input vector by using the current stage codebook;

wherein the scaling factor is found by bit mapping a quantization result of the previous stage, the quantization result of the previous stage comprises an energy parameter, the scaling factor is found by bit mapping a quantization result of the previous stage comprising: the scaling factor is found by bit mapping a higher n bits of a quantization index id_x E for the energy parameter, wherein, the idx_E totally has m bits, the higher n bits are idx_E>>(m−n) the sign '>>' indicates the operation of right shifting, the mapped scaling factor is $Y_{idx\_E}>>$ (m−n).

2. The multi-stage quantization of claim 1, wherein the scaling factor is determined according to a previous stage quantization error and a previous stage quantization vector.

3. The multi-stage quantization of claim 1, wherein when there is a plurality of scaling factors, the scaling factors are stored in an array and indices of the scaling factors are quantized.

4. The multi-stage quantization of claim 1, wherein the quantization result of the previous stage comprises a quantization result of an energy parameter currently to be quantized or a quantization result of a spectrum parameter.

5. A multi-stage quantization device comprising: a processor and a memory device, the processor is configured to read instructions stored in the memory device to perform quantization steps, the processor comprising:

a previous stage codebook storage unit configured to store a previous stage codebook or codebooks of two or more previous stages;

a reference codebook obtaining unit, configured to perform one of, obtain a reference codebook according to the previous stage codebook or codebooks of two or more previous stages stored by the previous stage codebook storage unit, and generate a reference codebook by combining vectors from the previous stage codebook stored by the previous stage codebook storage unit;

a scaling factor storage unit configured to store a scaling factor;

a current stage codebook obtaining unit, configured to obtain a current stage codebook according to the reference codebook by multiplying the reference codebook obtained by the reference codebook obtaining unit by the scaling factor stored by the scaling factor storage unit; and a vector quantization unit, adapted configured to quantize an input vector using the current stage codebook obtained by the current stage codebook obtaining unit, and a scaling factor mapping unit, configured to obtain the scaling factor by bit-mapping a quantization result of a previous stage and to transmit the scaling factor to the scaling factor storage unit;

wherein the quantization result of the previous stage comprises an energy parameter, the scaling factor is found by bit mapping a quantization result of the previous stage comprising: the scaling factor is found by bit mapping a higher n bits of a quantization index id_x E for the energy parameter, wherein, the idx_E totally has m bits, the higher n bits are idx_E>>(m−n) the sign '>>' indicates the operation of right shifting, the mapped scaling factor is $Y_{idx\_E}$>>(m−n).

6. The multi-stage quantization device of claim 5, further comprising:

a scaling factor determination unit, configured to determine the scaling factor according to a previous stage quantization error and a previous stage quantization vector.

7. The multi-stage quantization method of claim 1, wherein the scaling factor is found by bit mapping a quantization result of the previous stage comprises the index of the scaling factor is found by bit mapping a quantization result of the previous stage.

8. The multi-stage quantization device of claim 5, wherein the scaling factor mapping unit is configured to obtain index of the scaling factor by bit-mapping a quantization result of a previous stage and to transmit the scaling factor to the scaling factor storage unit.

* * * * *